United States Patent
Kim

(10) Patent No.: US 9,053,793 B2
(45) Date of Patent: Jun. 9, 2015

(54) SEMICONDUCTOR MEMORY DEVICE AND METHOD OF OPERATING THE SAME

(75) Inventor: Do Young Kim, Cheongju-si (KR)

(73) Assignee: SK Hynix Inc., Gyeonggi-do (KR)

(*) Notice: Subject to any disclaimer, the term of this patent is extended or adjusted under 35 U.S.C. 154(b) by 189 days.

(21) Appl. No.: 13/601,304

(22) Filed: Aug. 31, 2012

(65) Prior Publication Data

US 2013/0163333 A1 Jun. 27, 2013

(30) Foreign Application Priority Data

Dec. 21, 2011 (KR) .................. 10-2011-0139046

(51) Int. Cl.
| | | |
|---|---|---|
| G11C 11/34 | (2006.01) | |
| G11C 16/06 | (2006.01) | |
| G11C 16/34 | (2006.01) | |
| G11C 11/56 | (2006.01) | |

(52) U.S. Cl.
CPC ............. *G11C 16/06* (2013.01); *G11C 16/34* (2013.01); *G11C 11/5628* (2013.01); *G11C 16/3427* (2013.01); *G11C 16/3454* (2013.01)

(58) Field of Classification Search
USPC ............ 365/185.03, 185.11, 185.17, 185.18, 365/185.19, 185.22, 185.24, 185.29
See application file for complete search history.

(56) References Cited

U.S. PATENT DOCUMENTS

| | | | | |
|---|---|---|---|---|
| 7,349,263 B2 * | 3/2008 | Kim et al. | ................. | 365/185.19 |
| 7,652,925 B2 * | 1/2010 | Sim | .......... | 365/185.19 |
| 7,715,230 B2 * | 5/2010 | Kim et al. | ................. | 365/185.03 |
| 7,920,420 B2 * | 4/2011 | Lee | .......... | 365/185.03 |
| 8,238,164 B2 * | 8/2012 | Kim et al. | ................. | 365/185.22 |
| 8,305,817 B2 * | 11/2012 | Park et al. | ................. | 365/185.22 |
| 8,422,302 B2 * | 4/2013 | Hemink | .................. | 365/185.19 |
| 8,472,247 B2 * | 6/2013 | Yoon et al. | ................. | 365/185.19 |
| 8,539,138 B2 * | 9/2013 | Kim et al. | ................. | 365/185.19 |
| 8,730,736 B2 * | 5/2014 | Goda et al. | ................ | 365/185.19 |
| 8,767,475 B2 * | 7/2014 | Cho et al. | ................. | 365/185.19 |

\* cited by examiner

*Primary Examiner* — Trong Phan
(74) *Attorney, Agent, or Firm* — William Park & Associates Ltd.

(57) ABSTRACT

The semiconductor memory device includes a memory cell array configured to include a plurality of blocks, wherein each of the blocks has pages and each of the pages includes memory cells, and a peripheral circuit configured to program the memory cells to target program states. Here, the peripheral circuit programs the memory cells to temporary program states by applying program voltages increasing step-by-step by a first incremental value, and then programs the memory cells to the target program states by applying program voltages increasing step-by-step by a second incremental value.

9 Claims, 8 Drawing Sheets

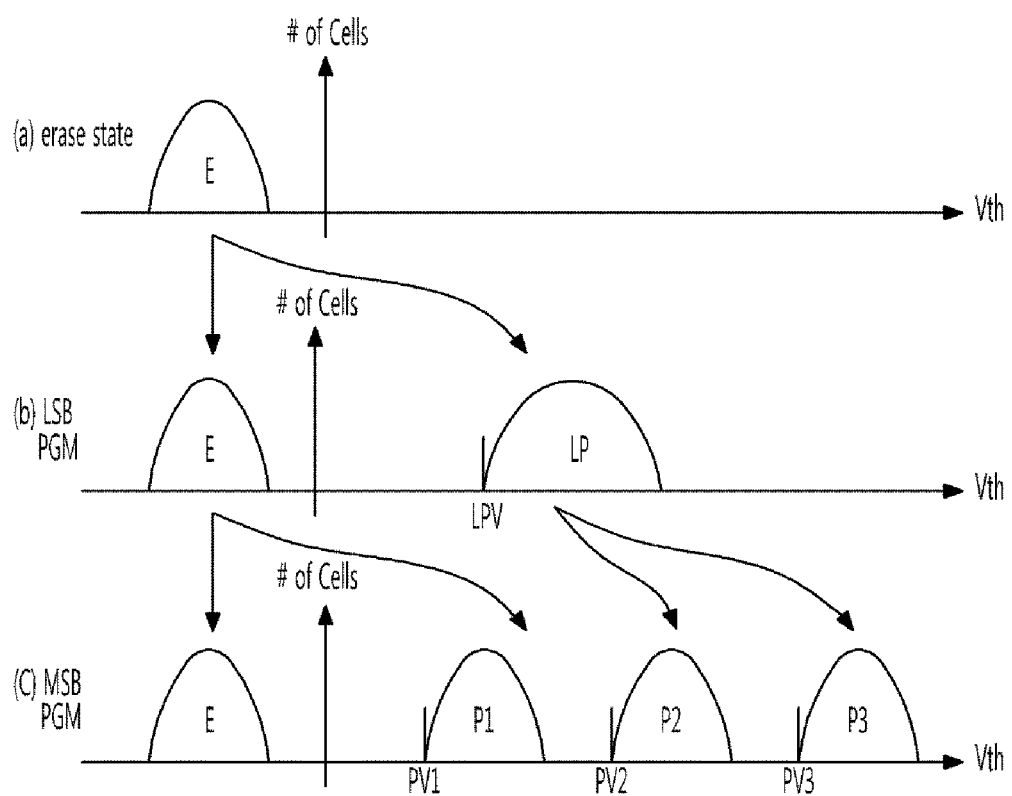

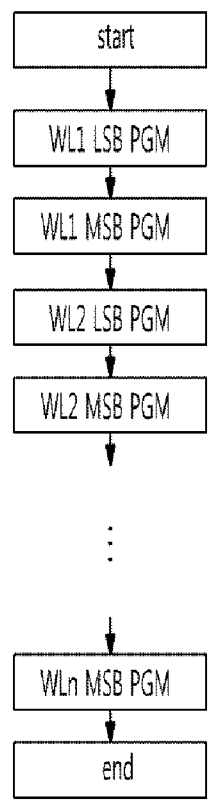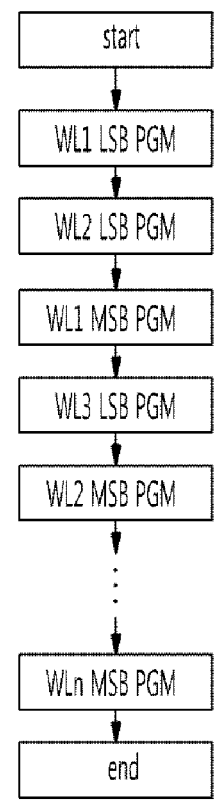

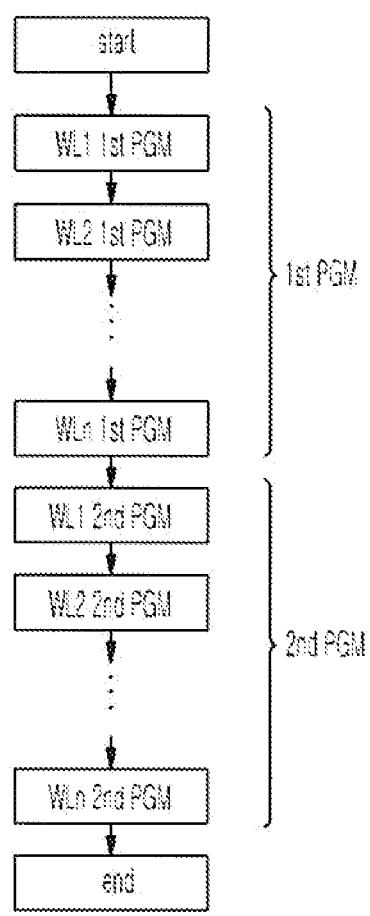

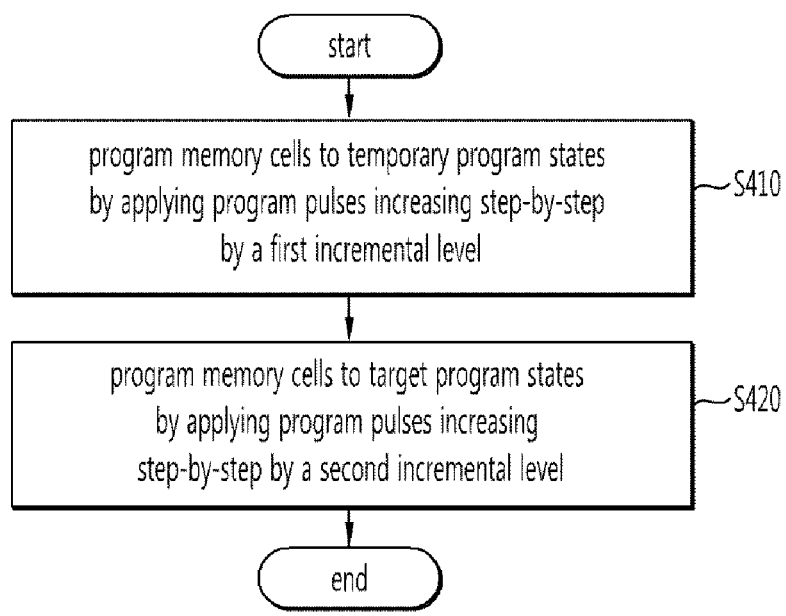

SEMICONDUCTOR MEMORY DEVICE AND METHOD OF OPERATING THE SAME

CROSS-REFERENCE TO RELATED APPLICATION

This application claims priority from Korean Patent Application No. 10-2011-0139046, filed on Dec. 21, 2011, the contents of which are incorporated herein by reference in its entirety.

BACKGROUND NODE OF THE INVENTION

1. Technical Field

The present invention generally relates to a semiconductor memory device and a method of operating the same, and relates to a semiconductor memory device for storing data and a method of operating the same.

2. Related Art

Recently, a semiconductor memory device, specifically a flash memory device where data in a memory cell is maintained without being extinguished when power is not supplied has been continuously used as a data storage medium. However threshold voltage distribution of a programmed memory cell in the flash memory device may be changed by various causes while a program operation is performed, and thus malfunction of the flash memory device may occur.

FIG. 1 and FIG. 2 are views illustrating a program method when data of 2 bits is stored in one memory cell in conventional flash memory device. Particularly, FIG. 1 illustrates a method of programming a most significant bit MSB page after a least significant LSB page is programmed and a program state formed according to the programming. FIG. 2 illustrates a method of programming a block including plural pages. In FIG. 1, the horizontal axis represents a threshold voltage of a memory cell and the vertical axis represents the number of memory cells.

In FIG. 1, before a program operation is performed, the memory cells have an erase state E. In the case where a least significant bit LSB data is programmed (i.e., step (b)), the memory cells have two states, i.e. erase state E and least program state LP according to a threshold voltage (i.e., Vth) distribution. Memory cells having a threshold voltage corresponding to the erase state E may maintain the erase state E or have the least program state LP. The least program state LP means a state obtained by programming a least significant bit LSB of data of 2 bits. After the LSB data is programmed, the most significant bit MSB data is programmed (i.e. step (C)). Memory cells having a threshold voltage corresponding to an erase state E of the least significant bit LSB may maintain the erase state E or be programmed to a first program state P1 at a first programming voltage PV1. Memory cells having a threshold voltage corresponding to the least program state LP at a Least programming voltage LPV may be programmed to a second program state P2 at a second programming voltage PV2, or a third program state P3 at a third programming voltage PV3 when the most significant bit MSB is programmed.

In FIG. 2(a), a block includes a page, every LSB and MSB of one page may be programmed (i.e., PGM), and then a program operation may be performed for the next page. For example, a LSB program and a MSB program regarding a WL1 are performed, and then a LSB program and a MSB program regarding a WL2 are performed. That is,a LSB program and MSB program regarding a WLk is performed, and then a LSB program and MSB program regarding a WLk+1 is performed, where k is a positive integer, greater than or equal to 1 and less than or equal to n−1. In FIG. 2(b), after the LSB of one page is programmed, the MSB of the previous page is programmed immediately. For example, a LSB program regarding each of a WL1 and a WL2 is sequentially performed, and then a MSB program regarding the WL1 is performed. A LSB program regarding the WL3 is performed, and then a MSB program regarding the WL2. That is, a MSB program regarding a WLk is performed after a LSB program regarding a WLk+1 is performed, where k is a positive integer, greater than or equal to 1 and less than or equal to n−1. It is known that interference in a direction of a word according to the method in FIG. 2(b) is smaller than that according to the method in FIG. 2(a). However, the time it takes for programming becomes longer in the case where the conventional method in FIG. 1 and FIG. 2 is used, and the width of the threshold voltage formed according to the programming is comparatively great. In addition, threshold voltage of memory cell, about which a program operation is finished, shifts due to interference when the program operation is performed. This occurrence causes the malfunction of the semiconductor memory device.

SUMMARY OF THE INVENTION

Various embodiments provide for semiconductor memory device enhancing operation characteristics and a method of operating the same.

A semiconductor memory device according to an embodiment includes a memory cell array configured to include a plurality of blocks, wherein each of the blocks has pages and each of the pages includes memory cells; and a peripheral circuit configured to program the memory cells to target program states. Here the peripheral circuit programs the memory cells to temporary program states by applying program voltages increasing step-by-step by a first incremental value, and then programs the memory cells to the target program states by applying program voltages increasing step-by-step by a second incremental value.

A method of operating a semiconductor memory device according to an embodiment includes programming memory cells to temporary program states by applying program voltages that increase step-by-step by a first incremental value in a first program step; and programming the memory cells to target program states by applying program voltages that increase step-by-step by a second incremental value in a second program step.

BRIEF DESCRIPTION OF THE DRAWINGS

The above and other features and advantages of the present invention will become readily apparent by reference to the following detailed description when considered in conjunction with the accompanying drawings wherein:

FIG. 1, FIG. 2(a), and FIG. 2(b) are views illustrating a program method when data of 2 bits is stored in one memory cell within a conventional flash memory device

FIG. 6 is a flowchart illustrating a method of programming one block including plural pages in an example where the data of 2 bits is stored in one memory cell in the semiconductor memory device in FIG. 3;

FIG. 8 is a flowchart illustrating the operation of a semiconductor memory device according to an embodiment.

DETAILED DESCRIPTION

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

In the present invention, operation characteristics of the semiconductor memory device may be enhanced.

Figure 3:
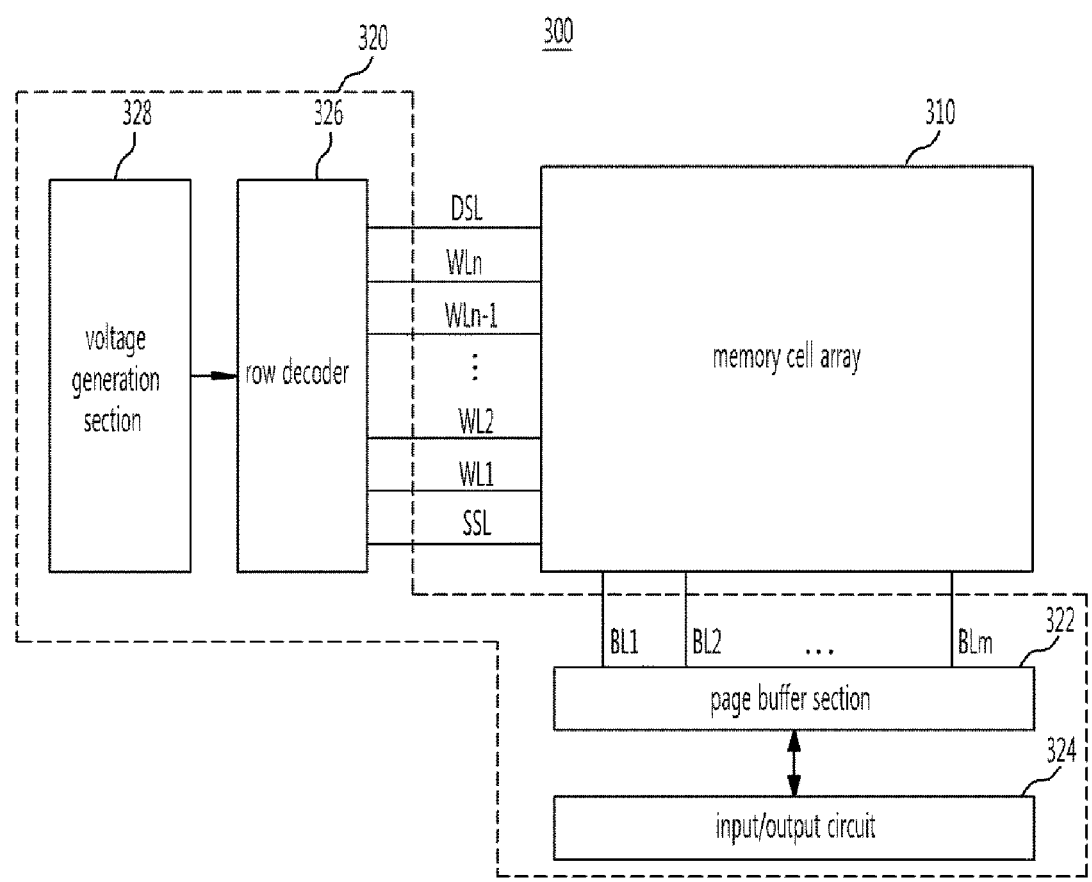
FIG. 3 is a view illustrating a semiconductor memory device according to an exemplary embodiment.

FIG. 3 is a view illustrating a semiconductor memory device according to an exemplary embodiment.

In FIG. 3, a semiconductor memory device 300 may include a memory cell array 310 and a peripheral circuit 320. In the case where the semiconductor memory device 300 may be a NAND flash memory device, the peripheral circuit 320 may include a page buffer section 322, an input/output circuit 324, a row decoder 326, and a voltage generation section 328.

The memory cell array 310 may be a data storage area of the semiconductor memory device 300 and may include memory cells (not illustrated) connected to bit lines BL (i.e., BL1, BL2 . . . BLm) and word lines WL (i.e., WLn, WLn−1 . . . WL2, WL1). The row decoder 326 and the memory cell array 310 may also be connected through source select lines SSL and drain select lines DSL. Each of the memory cells (not illustrated) in the memory cell array 310 may have an erase state or a program state. Each of the memory cells may store single bit data or multi bit data related to the program state. A memory cell for storing the single bit data may be referred to as a single level cell SLC, and a memory cell for storing multi bit data of above 2 bits may be defined as a multi level cell MLC. The single level cell SLC may have an erase state and one program state according to a threshold voltage. The multi level cell MLC may have an erase state and plural program states in accordance with a threshold voltage. The multi level cell MLC may be programmed to one of the threshold voltage distributions to store plural bits in one memory cell.

The page buffer section 322 may operate as a writing driver or a sensing amplifier according to an operation mode. For example the page buffer section 322 may operate as the sensing amplifier in a read operation mode, and it may operate as the writing driver in a program operation mode. The page buffer section 322 may receive data to be programmed from the input/output circuit 324 in the program operation, and may store the received data in a latch (not illustrated). The page buffer section 322 may provide a ground voltage to the bit line BL of memory cells to be programmed in the program operation. The page buffer section 322 may provide a program inhibition voltage to a bit line BL of memory cells of which programming is inhibited.

The input/output circuit 324 may deliver an address or program data, etc. inputted through an input/output terminal. The input/output circuit 324 may transmit a stored address to an address buffer (not illustrated), transmit program data to the page buffer section 322, and transmit a command to a command register (not illustrated). In the read operation, read data provided from the page buffer section 322 may be outputted to an outside through the input/output circuit 324.

The row decoder 326 may usually select the word line WL in response to a row address. The row decoder 326 may deliver various word line voltages provided from the voltage generation section 328 to word lines WL. When the program operation is performed, a program voltage may be provided to a selected word line and a pass voltage may be applied to a word line not selected. When the read operation is performed, the row decoder 326 may provide a read voltage provided from the voltage generation section 328 to the selected word line and may apply the pass voltage to the word line not selected. The voltage generation section 328 may provide a voltage for program of the semiconductor memory device 300.

Figure 4:
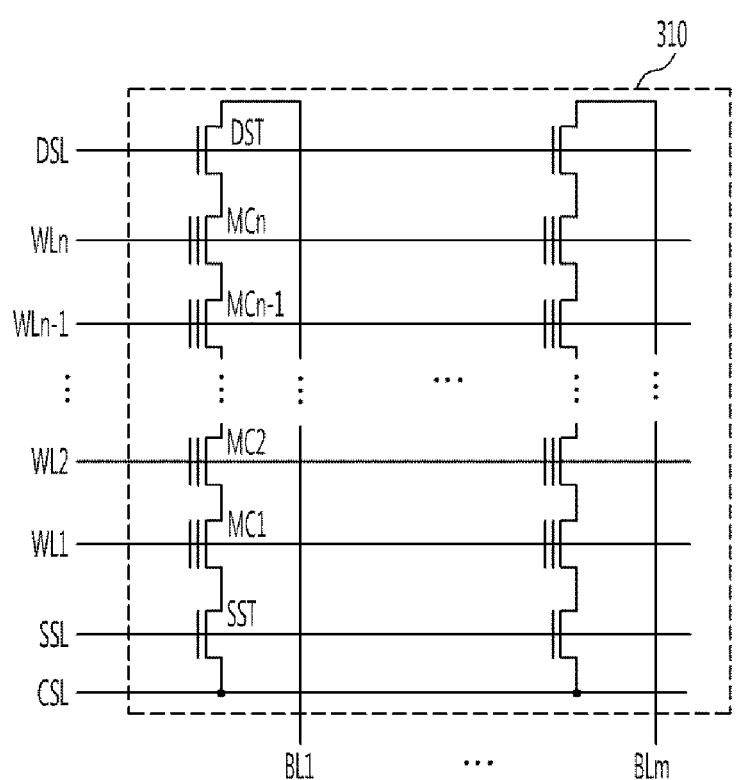
FIG. 4 is a view illustrating the memory cell array in FIG. 3.

FIG. 4 is a view illustrating the memory cell array in FIG. 3.

In FIG. 4, the memory cell array 310 may include cell strings ST (not illustrated) connected to corresponding bit lines BL (i.e., BL1 . . . BLm). [added that the ST was not illustrated because they were not identified in FIG. 4] The cell string ST has a drain select transistor DST connected to the bit line BL, a source select transistor SST connected to a common source line CSL, and memory cells MC or cell transistors MC (i.e., MCn, MCn−1 . . . MC2, MC1) connected in serial between the drain select transistor DST and the source select transistor SST. Gates of the drain select transistors DST are connected to a drain select line DSL, gates of the source select transistors SST are connected to a source select line SSL, and a control gate of each of the memory cells MC is connected to a corresponding word line WL (i.e., WLn, WLn−1 . . . WL2, WL1). The drain select transistor DST and the source select transistor SST may be general MOS transistors, and the memory cells MC may be a transistor having an electric charge storing layer such as a floating gate or a charge trap layer.

Figure 5:
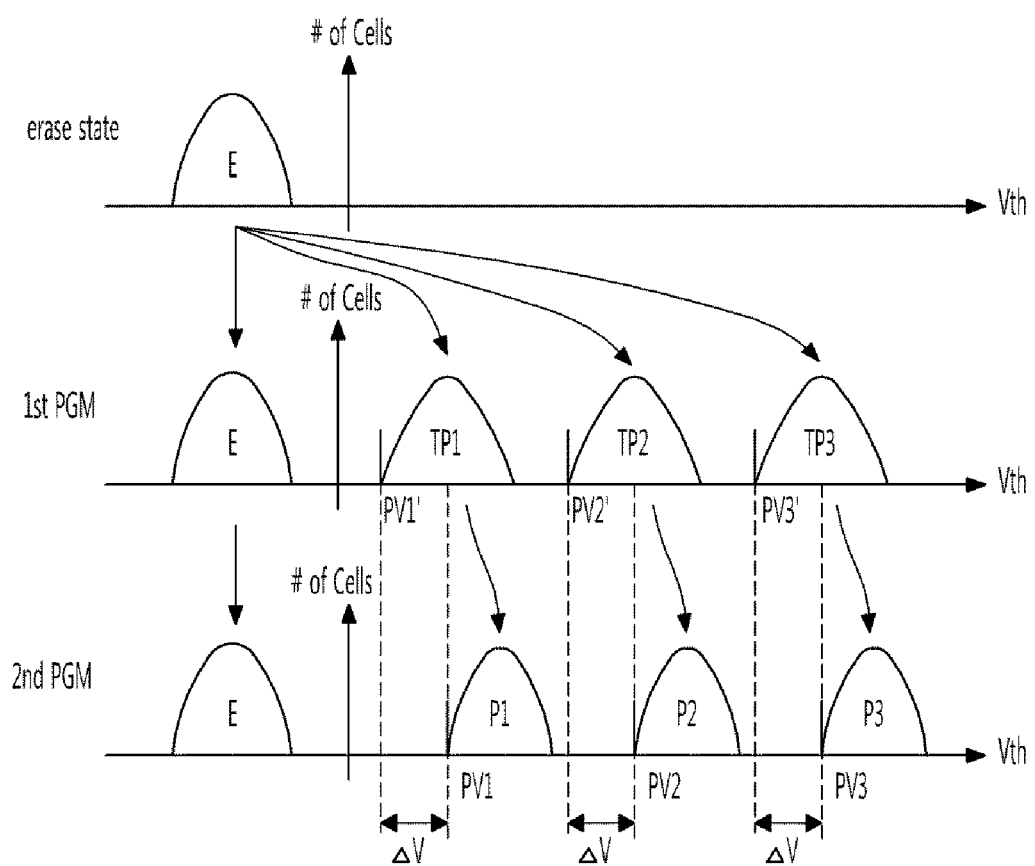
FIG. 5 is a view illustrating a program method in an example where data of 2 bits may be stored in one memory cell of the semiconductor memory device in FIG. 3 and a program state formed according to the program method.

FIG. 5 is a view illustrating a program method in the case where data of 2 bits is stored in one memory cell of the semiconductor memory device in FIG. 3 and a program state is formed according to the program method. In FIG. 5, the horizontal axis represents a threshold voltage of a memory cell and the vertical axis represents the number of memory cells.

In FIG. 5, in the case where data of 2 bits is stored in one memory of the semiconductor memory device 300, memory cells may have one erase state E, three temporary program states TP1, TP2, and TP3, and three target program states P1, P2, and P3 in a program operation. Three temporary program states TP1, TP2, and TP3 may mean temporary states in-between the program operation, and the memory cell may have finally one erase state E and three target program states P1, P2, and P3 in the case where the program operation is finished.

The semiconductor memory device 300 may use a program method different from the conventional program method where the most significant bit MSB and the least significant bit LSB are separately programmed in sequence. Additionally, memory cells in the semiconductor memory device 300 may be programmed to the temporary program state TP1, TP2, and TP3 corresponding to the erase state E in a first program step (i.e., $1^{st}$ PGM). Subsequently, the memory cells may be programmed to the target program state P1, P2, and P3 corresponding to each of the temporary program states TP1, TP2, and TP3, respectively, in a second program step (i.e., $2^{nd}$ PGM). The program operation of the memory cells is finished through the first program step and the second program step. The memory cells of the semiconductor memory device 300 may be programmed to a first target program state P1 via first temporary program state TP1 in a process of programming them from the erase state E to the first target program state P1, is programmed to second target program state P2 via second temporary program state TP2 in a process of programming them for the erase state E to the second target program state P2, and is programmed to third target program state P3 via third temporary program state TP3 in a process of programming them for the erase state E to the third target program state P3. Here, interval ΔV between a first verifying voltage PV1' for verifying the programming to the first temporary program state TP1 and a second verifying voltage PV1 for verifying the programming the first target program state P1 may be determined optionally. The interval ΔV between first verifying voltages PV1, PV2', and PV3' corresponding to the temporary program state TP1, TP2, and TP3 and second verifying voltages PV1, PV2, and PV3 corresponding to the target program states P1, P2, and P3 may be determined in consideration of the number of program voltages applied in the second program step. For example, the first verifying voltages PV1', PV2', and PV3' may be determined to levels corresponding to the second program step where the program operation is finished by using two or three program voltages. The interval ΔV between the first verifying voltages PV1', PV2', and PV3' corresponding to the temporary program state TP1, TP2, and TP3 and the second verifying voltages PV1, PV2, and PV3 corresponding to the target program states P1, P2, and P3 may vary on the basis of program velocity.

FIG. 6 is a flowchart illustrating a method of programming one block including plural pages in the case where data of 2 bits may be stored in one memory cell in the semiconductor memory device in FIG. 3.

Referring to FIG. 5 and FIG. 6, a first program step (i.e., 1st PGM) regarding each of word lines WL (i.e., WL1, WL2 . . . WLn) is performed. Memory cells connected to word lines WL (i.e., WL1, WL2 . . . WLn), i.e. n pages (i.e., 1st, 2nd . . . ) are sequentially programmed to temporal program states TP1, TP2, and TP3. If the first program step regarding each of word lines WL (i.e., WL1, WL2 . . . WLn) is finished, a second program step (i.e., 2nd PGM) regarding each of word lines WL (i.e., WL1, WL2 . . . WLn) is performed. The n pages are sequentially programmed corresponding to target program states P1, P2, and P3. That is, the pages are programmed in sequence to the temporary program states in the first program step, and they are programmed in sequence to the target program states in the second program step.

Figure 7A:
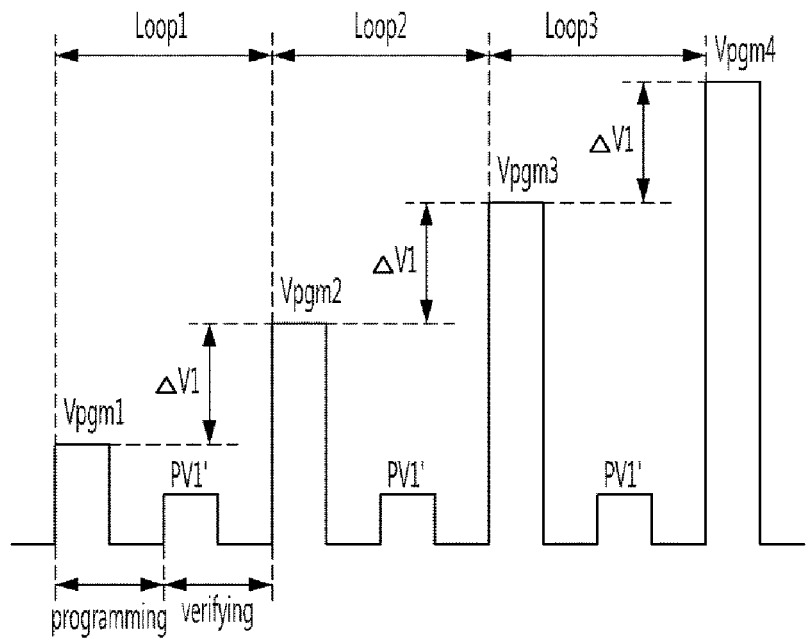
FIG. 7 is a view illustrating a program voltage applied to a selected word line in a semiconductor memory device according to an embodiment.
Figure 7B:
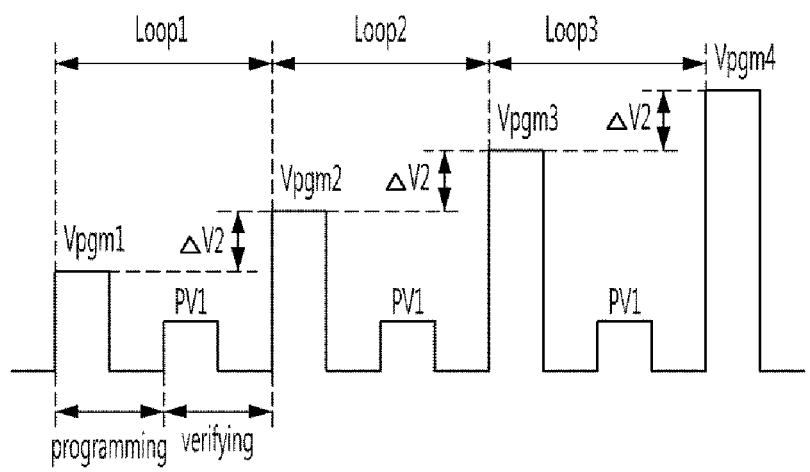

FIG. 7 is a view illustrating a program voltage applied to a selected word line in a semiconductor memory device according to an embodiment. Additionally, FIG. 7(a) illustrates program voltages Vpgm applied in the first step where the memory cells may be programmed to the temporary program states, and FIG. 7(b) illustrates program voltages Vpgm provided in the second step where the memory cells may be programmed to the target program states. The semiconductor memory device 300 (see FIG. 3) of an embodiment may use an incremental step pulse program ISPP method to narrow threshold voltage distribution of the memory cell. In the program operation, the memory cell may be programmed according to preset bias condition, e.g. a program voltage applied to the word line or a bit line voltage provided to the bit line. Since the program voltages increasing by a given incremental value may be applied to a selected word line until the program operation is finished, the program operation may be performed through plural program loops. Each of the program loops may include a program operation (i.e., programming) and a program verifying operation (i.e., verifying). The program voltage Vpgm may be applied to the selected word line in the program operation, and a program verifying voltage PV may be provided to the selected word line in the program verifying operation. The program verifying operation may verify whether or not the memory cell is programmed to the target program state.

Referring to FIG. 5 and FIG. 7(a), program voltages Vpgm1 to Vpgm4 applied to the selected word line augment step-by-step by first incremental value ΔV1. The verifying operation may verify whether or not the memory cell is programmed up to corresponding temporary program state TP1 after the program voltages Vpgm1 to Vpgm4 are applied. The verifying operation may determine based on the first verifying voltage PV1' whether or not the memory cell is programmed up to the temporary program state TP1.

Referring to FIG. 5 and FIG. 7(b), program voltages Vpgm1 to Vpgm4 applied to the selected word line augment step-by-step by second incremental value ΔV2. The verifying operation may verify whether or not the memory cell is programmed to corresponding target program state P1 after the program voltages Vpgm1 to Vpgm4 are applied. The verifying operation determines based on the second verifying voltage PV1 whether or not the memory cell is programmed to the target program state P1. The first incremental value ΔV1 in FIG. 7(a) is greater than the second incremental value ΔV2 in FIG. 7(b). Accordingly, the first program step is completed comparative rapidly, but width of threshold voltage distribution of the temporary program state is comparatively great. The second program step is finished comparative slowly, but width of threshold voltage distribution of the target program state is comparatively narrow.

Furthermore, a verifying voltage is applied in the verifying section of each of the program loops Loop 1 to Loop 3 in FIG. 7(a) and FIG. 7(b), but the verifying voltage may not be not provided in the first program loop Loop 1 and may be applied in the second program loop Loop 2 and the following loop "to "Furthermore, a verifying voltage is applied in the verifying section of each of the program loops Loop1 to Loop 3 in FIG. 7(a) and FIG. 7(b), but the verifying voltage may not be provided in the first program loop Loop 1 and may be applied in the second program loop Loop 2 and the following loop.

FIG. 8 is a flowchart illustrating operation of a semiconductor memory device according to an embodiment.

In FIG. 8, memory cells may be programmed to temporary program states by applying program voltages increasing step-by-step by a first incremental value in a first program step S410, and they may be programmed to target program states by applying program voltage increasing step-by-step by second incremental value in a second program step S420.

The second incremental value may be smaller than the first incremental value. As a result, the first program step S410 has an effect where the width of threshold voltage distribution is great but program time reduces, and the second program step S420 forms the threshold voltage distribution having a more narrow width by using the reduced program time. The number of the temporary program states may be identical to that of the target program states. The temporary program states may correspond to one-to-one with the target program states. An interval between first verifying voltages corresponding to the temporary program states and second verifying voltages corresponding to the target program states may be determined considering the number of the program voltages increasing step-by-step applied in the second program step. For example, the interval between the first verifying voltages and the second verifying voltages corresponding to the target program states is determined based on the second program step where the program operation is completed by applying two or three program voltages. The interval between the first verifying voltages corresponding to the temporary program states and the second verifying voltages corresponding to the target program states may vary depending on program velocity. Accordingly, the semiconductor memory device may further include a means for checking the program velocity.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor memory device comprising:
a memory cell array configured to include a plurality of blocks, wherein each of the blocks has pages and each of the pages includes memory cells; and a peripheral circuit configured to program the memory cells to first to nth target program states,
wherein the pages are coupled to different word lines, respectively,
wherein the peripheral circuit programs memory cells of a first page selected from the pages to first to nth temporary program states by applying program voltages increasing step-by-step by a first incremental value, and then programs memory cells of a second page selected from the pages to the first to nth temporary program states,
wherein the peripheral circuit programs the memory cells of the first page to the first to nth target program states from the first to nth temporary program states, respectively, by applying program voltages increasing step-by-step by a second incremental value after the memory cells of the second page are programmed to the first to nth temporary program states.

2. The semiconductor memory device of claim 1, wherein the second incremental value is smaller than the first incremental value.

3. The semiconductor memory device of claim 1, wherein an interval between first verifying voltages corresponding to the first to nth temporary program states and second verifying voltages corresponding to the first to nth target program states is determined based on a number of the program voltages increasing step-by-step by the second incremental value.

4. The semiconductor memory device of claim 1, wherein an interval between first verifying voltages corresponding to the first to nth temporary program states and second verifying voltages corresponding to the first to nth target program states varies based on a program velocity.

5. The semiconductor memory device of claim 1 wherein the pages in each of the blocks are programmed to the first to nth temporary program states by applying the program voltages increasing step-by-step by the first incremental value, and then are programmed to the first to nth target program states by applying the program voltages increasing step-by-step by the second incremental value.

6. A method of operating a semiconductor memory device, the method comprising:
programming memory cells of a first page selected from a plurality of pages which are coupled to different word lines, respectively, to first to nth temporary program states by applying program voltages that increase step-by-step by a first incremental value in a first program step;
programming memory cells of a second page selected from the plurality of pages to the first to nth temporary program states; and
programming the memory cells of the first page to first to nth target program states from the first to nth temporary program states, respectively, by applying program voltages that increase step-by-step by a second incremental value in a second program step after the memory cells of the second page are programmed to the first to nth temporary program states.

7. The method of claim 6, wherein the second incremental value is smaller than the first incremental value.

8. The method of claim 6, wherein an interval between first verifying voltages corresponding to the first to nth temporary program states and second verifying voltages corresponding to the first to nth target program states is determined in consideration of the number of the program voltages increasing step-by-step applied in the second program step.

9. The method of claim 6, wherein an interval between first verifying voltages corresponding to the first to nth temporary program states and second verifying voltages corresponding to the first to nth target program states varies based on a program velocity.

* * * * *